(12) United States Patent
Balamurugan et al.

(10) Patent No.: US 7,313,181 B2
(45) Date of Patent: Dec. 25, 2007

(54) CALIBRATION OF SCALE FACTOR IN ADAPTIVE EQUALIZERS

(75) Inventors: Ganesh Balamurugan, Urbana, IL (US); Bryan K. Casper, Hillsboro, OR (US); James E. Jaussi, Hillsboro, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 538 days.

(21) Appl. No.: 10/660,415

(22) Filed: Sep. 10, 2003

(65) Prior Publication Data

US 2005/0053126 A1    Mar. 10, 2005

(51) Int. Cl.
*H03H 7/30* (2006.01)
*G06F 17/10* (2006.01)

(52) U.S. Cl. ...................... 375/232; 708/322

(58) Field of Classification Search ........ 375/229–236, 375/377; 708/300, 301, 318, 322, 323, 200, 708/100, 319; 333/18, 28 R
See application file for complete search history.

(56) References Cited

U.S. PATENT DOCUMENTS

| | | | | |
|---|---|---|---|---|
| 4,491,930 | A * | 1/1985 | Hyatt | 708/3 |
| 6,111,878 | A * | 8/2000 | Powell | 370/395.62 |
| 6,240,134 | B1 * | 5/2001 | Sandri et al. | 375/234 |
| 6,286,021 | B1 * | 9/2001 | Tran et al. | 708/322 |
| 6,618,740 | B1 | 9/2003 | Staszewski | |
| 6,621,330 | B1 * | 9/2003 | Jaussi et al. | 327/552 |
| 6,771,717 | B1 * | 8/2004 | Kukkula et al. | 375/343 |
| 6,904,086 | B2 | 6/2005 | Nishimura et al. | |
| 6,985,492 | B1 * | 1/2006 | Thi et al. | 370/429 |
| 7,079,576 | B2 * | 7/2006 | Bologna et al. | 375/234 |
| 2005/0163331 | A1 * | 7/2005 | Gao et al. | 381/93 |

FOREIGN PATENT DOCUMENTS

TW        498637        8/2002

OTHER PUBLICATIONS

"International Search Report for corresponding PCT Application No. PCT/US2004/029055", (Jan. 18, 2005), 3 pgs.
Alexander, S. T., "Transient Weight Vector Properties of the Finite Precision LMS Algorithm", *Conference Record, Nineteenth Asilomar Conference on Circuits, Systems, and Computers.*, (Nov. 1985), 640-644.

(Continued)

*Primary Examiner*—Mohammad Ghayour
*Assistant Examiner*—Vineeta Panwalkar
(74) *Attorney, Agent, or Firm*—Schwegman, Lundberg & Woessner, P.A.; Gregory J. Gorrie

(57) ABSTRACT

An adaptive equalizer finite impulse response (FIR) filter for high-speed communication channels with modest complexity, where the filter is iteratively updated during a training sequence by a circuit performing the update: $\bar{h}(t+1)=\bar{h}(t)+\mu[\text{sgn}\{d(t)\}-\text{sgn}\{z(t)-Kd(t)\}]\text{sgn}\{\bar{x}(t)\}$, where $\bar{h}(t)$ is the filter vector representing the filter taps of the FIR filter, $\bar{x}(t)$ is the data vector representing present and past samples of the received data $x(t)$, $d(t)$ is the desired data used for training, $z(t)$ is the output of the FIR filter, $\mu$ determines the memory or window size of the adaptation, and K is a scale factor taking into account practical limitations of the communication channel, receiver, and equalizer. Furthermore, a procedure and circuit structure is provided for calibrating the scale factor K.

18 Claims, 10 Drawing Sheets

OTHER PUBLICATIONS

"Office Action and Search Report in corresponding Taiwanese Patent Application No. 93127273", (w/ English Translation), (May 18, 2007), 8 pgs.

"International Search Report for corresponding PCT Application No. PCT/US2004/029055", (Jan. 18, 2005), 3 pgs.

Alexander, S. T., "Transient Weight Vector Properties of the Finite Precision LMS Algorithm", *Conference Record, Nineteenth Asilomar Conference on Circuits, Systems, and Computers.*, (Nov. 1985), 640-644.

* cited by examiner

CALIBRATION OF SCALE FACTOR IN ADAPTIVE EQUALIZERS

FIELD

The present invention relates to communication circuits, and more particularly, a circuit for adaptive equalization of a communication channel.

BACKGROUND

FIG. 1 provides a high-level abstraction of a portion of a computer server or system, where microprocessor 102 resides on board 104 and communicates with memory 106 on board 108. The communication is by way of striplines on backplane 110. Backplane 110 is connected to boards 104 and 108 by connectors 112. Not shown in FIG. 1 are other memory units and microprocessors, where the various microprocessors and memory units may communicate to one another so as to access or write data and instructions.

Communication of signals over backplane 110 may be modeled by transmission line theory. Often, the signaling is based upon differential signaling, whereby a single bit of information is represented by a differential voltage. For example, FIG. 2a shows drivers 202 and 204 driving transmission lines 206 and 208, respectively. For differential signaling, drivers 202 and 204 drive their respective transmission lines to complementary voltages. Typical curves for the node voltages at nodes n1 and n2 for a bit transition are provided in FIG. 2b, where the bit transition is indicated by a dashed vertical line crossing the time axis. The information content is provided by the difference in the two node voltages.

For short-haul communication, such as for the computer server in FIG. 1, the signal-to-noise ratio is relatively large. If the transmission lines are linear, time-invariant systems having a bandwidth significantly greater than that of the transmitted signal, then a relatively simple receiver architecture may be employed to recover the transmitted data. Such a receiver is abstracted by comparator 210, which provides a logic signal in response to the difference in the two received voltages at ports 212 and 214.

However, every transmission line has a finite bandwidth, and for signal bandwidths that are comparable to or exceed the transmission line (channel) bandwidth, intersymbol interference may present a problem. Furthermore, actual transmission lines may have dispersion, whereby different spectral portions of a signal travel at different speeds. This may result in pulse spreading, again leading to intersymbol interference. As a practical example, for high data rates such as 10 Gbps (Giga bits per second), the transmission lines used with backplanes or motherboards are such that intersymbol interference is present.

Channel equalization is a method in which one or more filters are employed to equalize the channel to help mitigate intersymbol interference. These filters may be sampled-data (discrete-time) filters, where a time index t is a discrete variable, or they may be continuous-time filters, where the time index is a continuous variable. Many channel equalizers are realized by a Finite Impulse Response (FIR) filter employed at the receiver. A FIR is a sampled-data filter. FIG. 3 is an abstraction of a FIR filter structure, where x(t) is the input (received) signal to the FIR filter and z(t) is the filtered output. In the case of differential signaling, x(t) and z(t) may be viewed as representing differential signals. The filter impulse response is represented by a n dimensional vector denoted as $\bar{h}$, where the filter weights are the components of this vector and are denoted by $[\bar{h}]_i$, $i=0,1,\ldots,n-1$. Multipliers 302 and summer 304 may be realized in the analog or digital domain. For the embodiments described in these letters patent, multipliers 302 and summer 304 are realized in the analog domain.

In many adaptive equalization schemes, the filter vector is updated during a training time interval, and then remains fixed for some period of time. During training, a known sequence is transmitted over a communication channel to the receiver, and the filter vector is synthesized during the training time interval. Many algorithms have been developed to synthesize the filter vector. The well-known LMS (Least Mean Square) algorithm is an iterative technique based upon the method of steepest descent (gradient) to minimize a squared error.

The LMS algorithm may be written as the following iterative procedure performed during the training time interval:

$$\bar{h}(t+1)=\bar{h}(t)+\mu[Kd(t)-z(t)]\bar{x}(t),$$

where $\bar{x}(t)$ is a n dimensional received data vector with components given by $[\bar{x}(t)]_i=x(t-i)$ for $i=0, 1, \ldots, n-1$, $\mu$ is a positive weight determining the filter "memory" or "window size" and may be viewed as the step-size in the steepest descent method, d(t) represents the known transmitted data during the training time interval (the training sequence), and K is a positive scale factor. The above iteration is performed during a training time interval $t=1, \ldots, T$, where an initial $\bar{h}(0)$ is chosen and at the end of the training time interval, the filter vector $\bar{h}$ is set equal to $\bar{h}(T)$, i.e., $\bar{h}=\bar{h}(T)$.

In many analog implementations the filter weights assume discrete values limited to some fixed range, and the scale factor K takes into account this finite range of the filter weights as well as practical implementations of the filtering. For example, for bipolar differential signaling the known training sequence d(t) may take on either of the values $V_{CC}$ or $-V_{CC}$, where $V_{CC}$ is a supply voltage, but in practice the filtered output z(t) is always in magnitude less than the supply voltage. In this case, K<1.

To simplify the computations needed to synthesize the filter vector, the so-called sign-sign-LMS algorithm has been used:

$$\bar{h}(t+1)=\bar{h}(t)+\mu sgn\{[Kd(t)-z(t)]\}sgn\{\bar{x}(t)\},$$

where sgn{ } is the sign function. The sign-sign-LMS algorithm, although widely used due to its simplicity of implementation, has been found to have some undesirable properties when used in adaptive high-speed equalizers with relatively low to moderate length words (e.g., four to six bits) for the filter weights. Because the probability of filter weight update during adaptation is high, there is a significant amount of residual noise in the filter weights, even after convergence of the algorithm. This residual noise may be reduced by choosing a longer window (smaller $\mu$), but this increases the convergence time, or in other words, the training time interval. Another disadvantage found in many instances is that the converged filter weights are relatively sensitive to the scale factor K, whose optimum value has been found to be difficult to determine.

DESCRIPTION OF EMBODIMENTS

Figure 1:
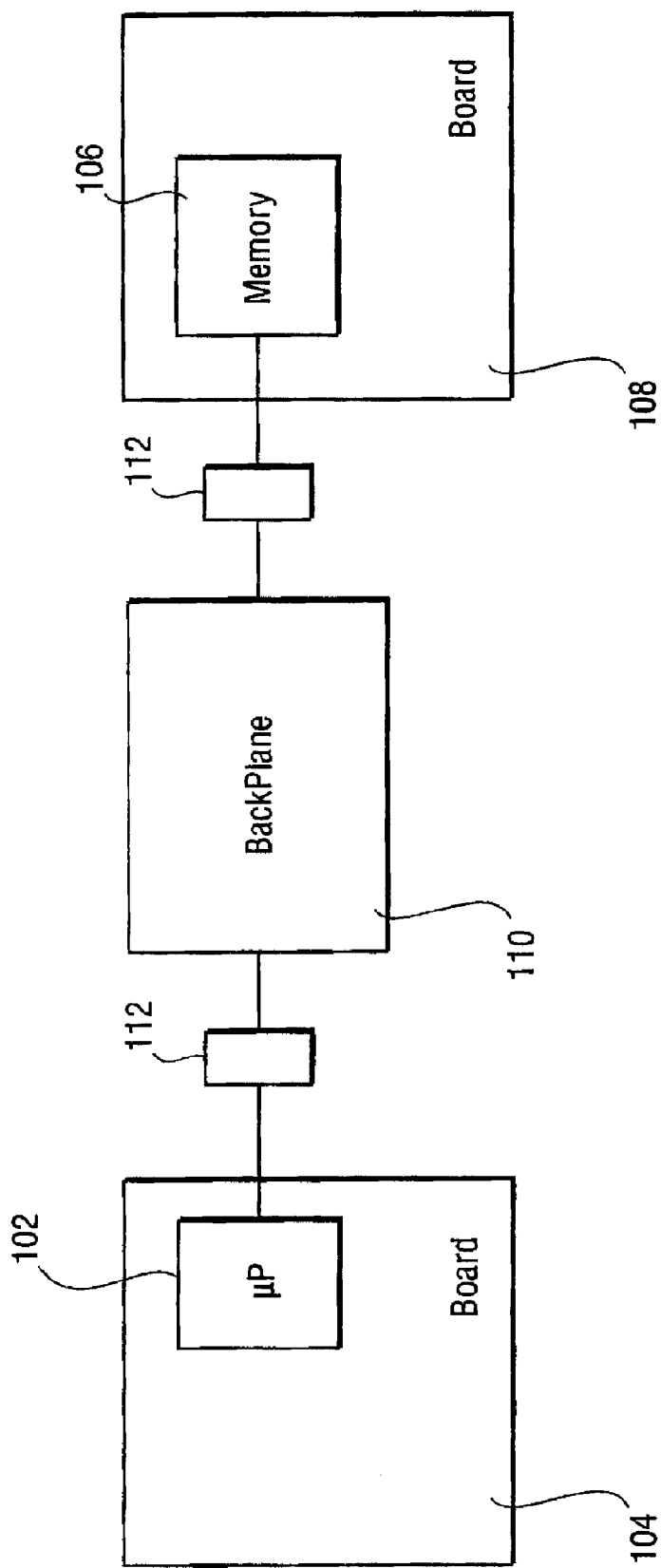
FIG. 1 is a high-level abstraction of a server system, illustrating signaling between boards via a backplane.
Figure 2A:
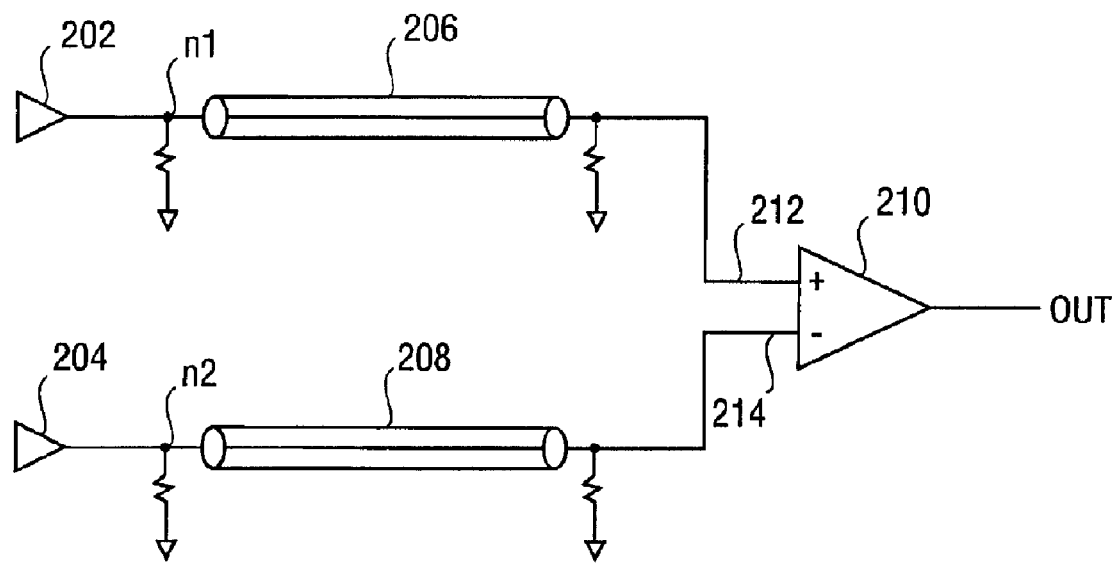
FIG. 2*a* illustrates differential signaling on two transmission lines.
Figure 2B:
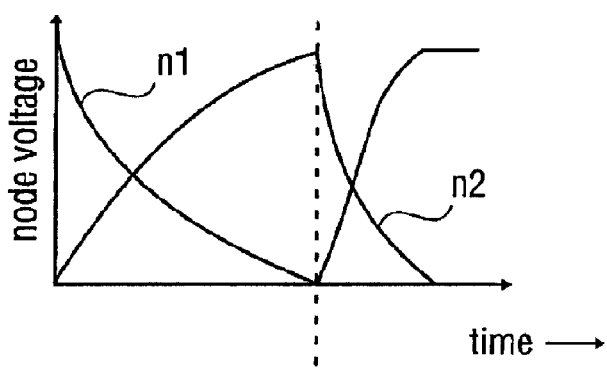
FIG. 2*b* shows typical voltage curves representing differential signaling on the transmission lines of FIG. 2*a*.
Figure 3:
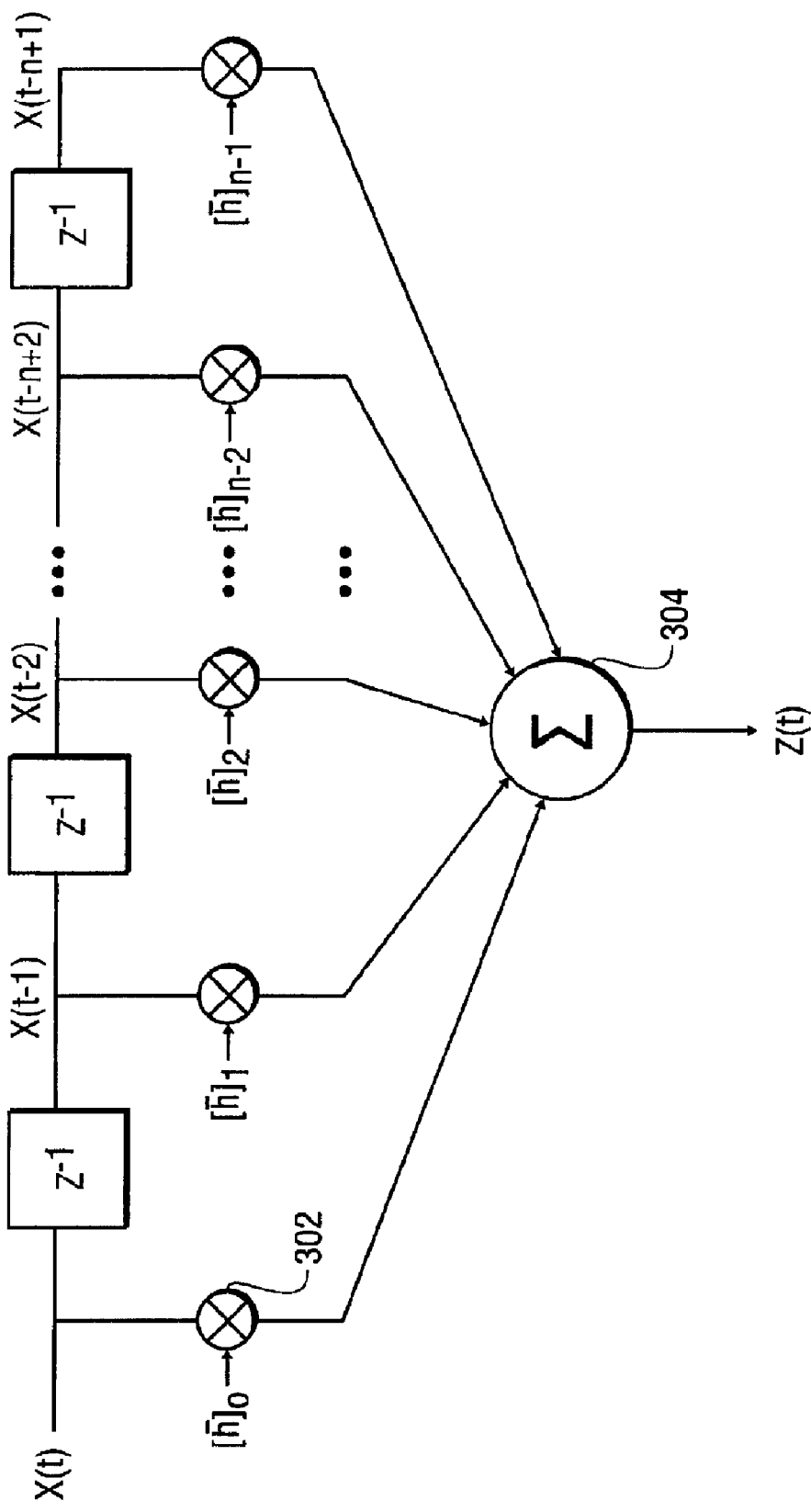
FIG. 3 illustrates a finite impulse response (FIR) filter, or tap delay-line.
Figure 4:
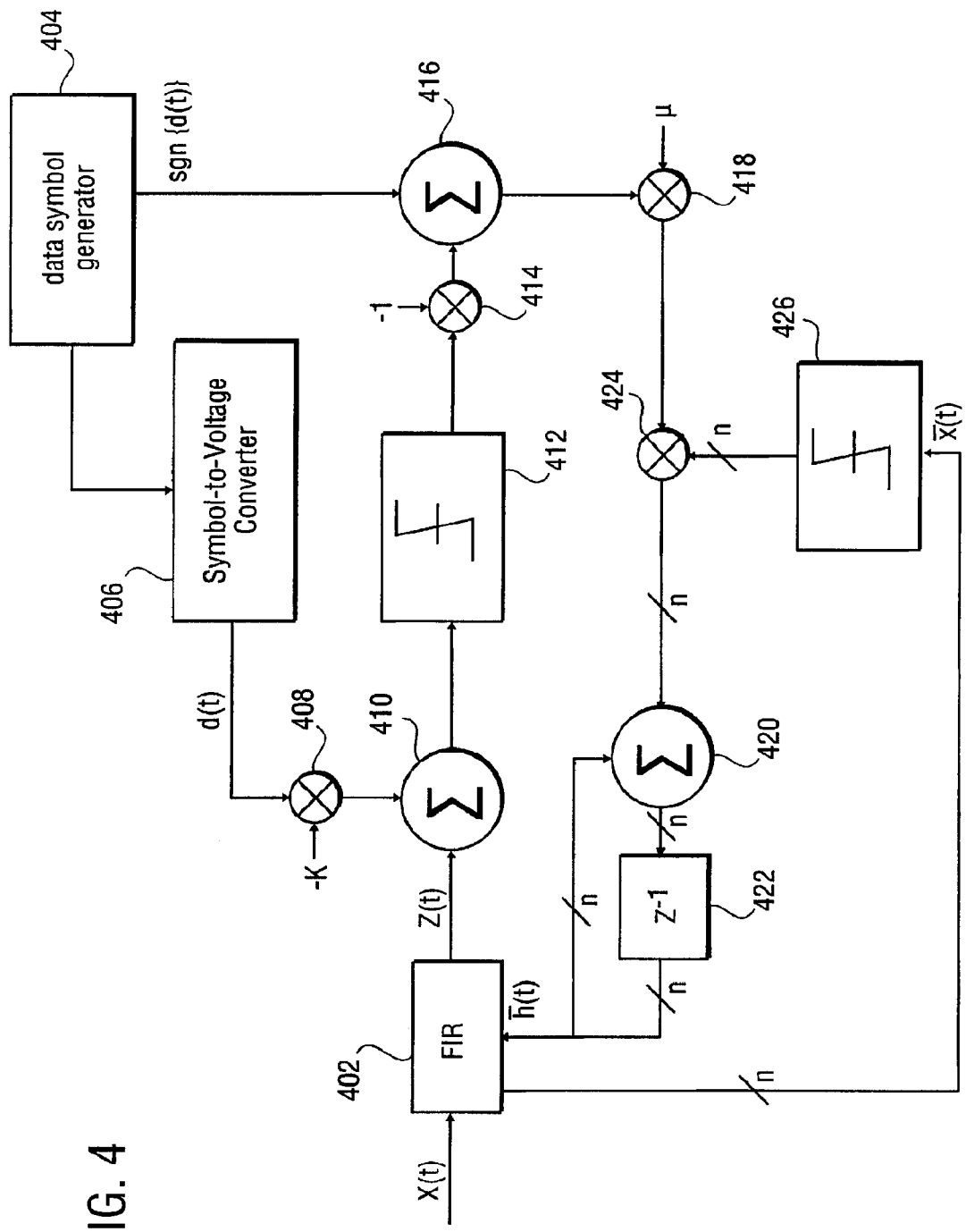
FIG. 4 illustrates a circuit at a high-level functional level for implementing adaptive equalization as taught in these letters patent.

FIG. 4 provides an abstraction of an embodiment of the present invention. The embodiment of FIG. 4 performs the following adaptive update:

$$\overline{h}(t+1) = \overline{h}(t) + \mu[sgn\{d(t)\} - sgn\{z(t) - Kd(t)\}]sgn\{\overline{x}(t)\}, \quad (1)$$

which may be termed the conditional update sign-sign LMS algorithm. Equalizer 402 is a FIR filter with filter weights [$\overline{h}(t)]_i$, i=0, 1, . . . , n−1, and provides the filtered output $$z(t) = \sum_{i=0}^{n-1} [\overline{h}(t)]_i x(t-i)$$

Each filter weight is represented by a set of discrete voltages taking on either 0 or $V_{CC}$ (LOW or HIGH), so that each filter weight may be viewed as a discrete variable in the digital domain represented by a finite number of bits. However, the filtering is performed in the analog domain so that the filtered output z(t) is an analog voltage signal. If differential signaling is employed, then both analog voltages x(t) and z(t) are differential signals. An example of FIR 402 at the circuit level will be described later. Not shown (for simplicity) in FIG. 4 are clock signals and latches to perform the various multiplications, summations, comparisons, and symbol generation at discrete times t=0, 1, . . . , T during the training sequence.

Data symbol generator 404 provides a sequence of voltages in the digital domain representing sgn{d(t)}. Because sgn{ } obviously assumes only one of two values, the sequence of voltages representing sgn{d(t)} may be viewed as a sequence of binary values 0 or 1, which may be stored in a memory unit or generated by a finite state machine. Data symbol generator 404 also provides a sequence of voltages in the digital domain representing d(t). In digital communications, the transmitted symbols range over a finite set, so that (remembering that d(t) is the transmitted training sequence) each d(t) may be represented by a finite number of bits. These bits may be stored in memory, or generated by a finite machine. In the case of bipolar signaling, only one bit of information is needed to represent d(t), so the same sequence used to represent sgn{d(t)} may also represent d(t). Circuits for data symbol generator 404 are relatively straight forward to synthesize. For example, in the bipolar signaling case, it is well known that the use of feedback shift registers may be used to generate the binary bits representing the data d(t).

Symbol-to-voltage converter 406 converts the digital domain voltages representing d(t) into analog voltages representing d(t). For example, consider the case in which differential bipolar signaling is employed. In this case, only one bit of information, for example a voltage 0 or $V_{CC}$, is needed to represent d(t) and is provided to the input of symbol-to-voltage converter 406, and two voltages are used to represent the differential output voltage of symbol-to-voltage converter 406. For example, in this case, symbol-to-voltage converter 406 may provide the differential voltage [0, $V_{CC}$] in response to one of its input voltages, say 0, and the differential voltage [$V_{CC}$, 0] in response to the input voltage $V_{CC}$. Such a circuit is of course obvious, and for the more general case, circuits for symbol-to-voltage converter 406 are straightforward to implement.

Multiplier 408 multiplies the analog voltage d(t) by the negative of the scale factor, −K. This multiplication is performed in the analog domain, but just as for the filter $\overline{h}(t)$, the scale factor is represented by a set of discrete voltages taking on the values 0 or $V_{CC}$ (LOW or HIGH), so that K is represented by a finite number of bits. Summer 410 adds the analog voltage −Kd(t) to the filtered output z(t), which is provided to the input of comparator 412. The multiplier 408 and summer 410 have the same structure as a filter tap, so that an example circuit for multiplier 408 and summer 410 is described later in connection with FIR 402.

Comparator 412 provides a logic output signal indicative of the difference of its two input signals (each input signal is part of a differential voltage in the differential signaling case), so that it outputs sgn{z(t)−Kd(t)} as a discrete voltage 0 or $V_{CC}$ (LOW or HIGH) in the digital domain. (It is immaterial whether comparator 412 evaluates sgn{0} as a LOW or HIGH voltage.) Comparator 412 also includes a latch for latching its output voltage. (For simplicity, clock signals are not shown in FIG. 4.) Multiplier 414 and summer 416 effectively subtract sgn{z(t)−Kd(t)} from sgn{d(t)}, and multiplier 418 multiplies this difference by the filter memory parameter μ, which is then provided as an operand to multiplier 424. The data vector $\overline{x}(t)$ is provided to comparator 426, which outputs the vector sgn{$\overline{x}(t)$} as an operand to multiplier 424. (Comparator 426 also includes a latch.) The data vector $\overline{x}(t)$ may be provided by FIR 402 because this vector is also used by FIR 402 to perform filtering. The values of $\overline{x}(t)$ may be obtained by samplers, not shown for simplicity. Multiplier 424 multiplies its two operands together, so that each component of sgn{$\overline{x}(t)$} is multiplied by the scalar μ[sgn{d(t)}−sgn{z(t)−Kd(t)}], and this result is provided to summer 420. Summer 420, delay element 422, and the feedback from delay element 422 to summer 420 perform the desired iteration on the filter weights as expressed by equation (1).

At the end of the training sequence, the filter weights for equalization are given by $\overline{h}(T)$, in which case FIR 402 may be disconnected from the circuit so as to provide the equalized output z(t) for t>T.

Multipliers 414 and 418, summers 416 and 420, and unit delay shift 422 operate in the digital domain, whereas the multiplications and summation performed within FIR 402, as well as summer 410 and multiplier 408, are performed in the analog domain. It should be remembered that the multiplication weights $\bar{h}(t)$ and K in FIG. 4 are discrete-valued signals (i.e., digital signals) represented by a finite number of bits (HIGH and LOW voltages). Although d(t) is a discrete-valued signal due because of the nature of digital communication, it is nevertheless viewed as an analog signal because it is a differential voltage input to a voltage-to-current converter when performing the multiplication indicated by multiplier 408, as described later. Circuits for performing operations in the digital domain (i.e., logic circuits) are well known, and need not be described here. A circuit implementation for performing the analog filtering (multiplication and summation) in FIG. 4 is now described below.

Figure 5:
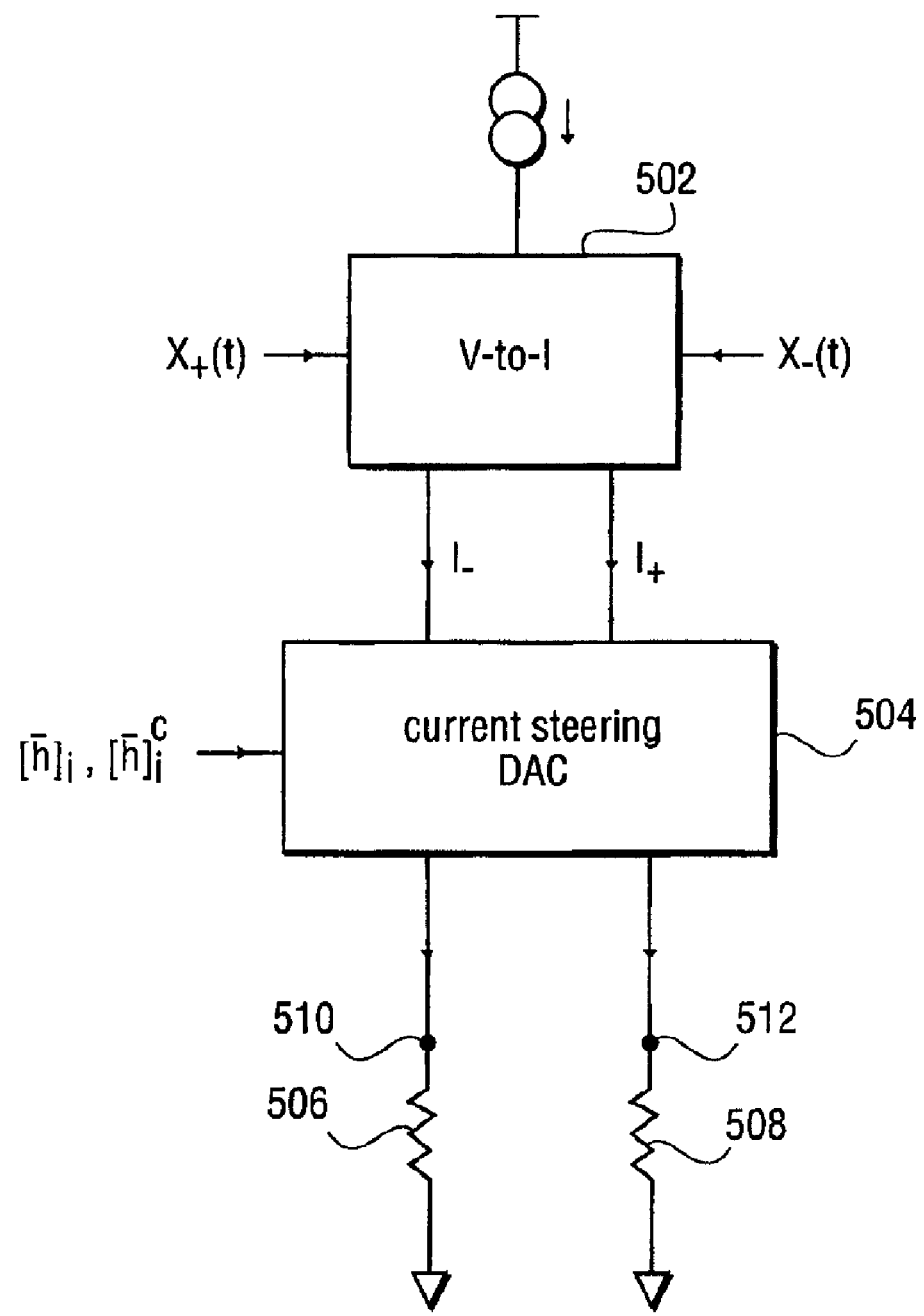
FIG. 5 illustrates a circuit at a high-level functional level for implementing multiplication in the analog domain for the circuit of FIG. 4.

A circuit to implement multiplication in the analog domain utilizing differential signals is shown in FIG. 5, where the differential signal voltage x(t), represented by the two voltages $\{x_+(t), x_-(t)\}$, is effectively multiplied by $[\bar{h}]_i$, the $i^{th}$ component of the filter vector $\bar{h}$. Multiplication by $[\bar{h}]_i$ also involves its bit-wise logical complement, denoted as $[\bar{h}]_i^c$, which is easily generated. The multiplier indicated by FIG. 5 comprises voltage-to-current converter 502 and current steering DAC (digital-to-analog converter) 504. Voltage-to-current converter 502 provides differential current $\{I_+, I_-\}$ such that the difference $I_+-I_-$ is proportional to $V_+-V_-$, that is, $I_+-I_-=\alpha(V_+-V_-)$, where $\alpha$ is a transconductance scalar. Current steering DAC 504 steers currents $\gamma[\bar{h}]_i I_-$ and $\gamma[\bar{h}]_i I_+$, respectively, to loads 506 and 508, and shunts the rest of the current (if any) to ground. The scalar $\gamma$ is given by $\gamma=1/\max\{abs([\bar{h}]_i)\}$. This scalar is introduced because current steering DAC 504 can at most steer all of currents $I_+$ and $I_-$ to, respectively, loads 508 and 506. With this scalar, the absolute value of $\gamma[\bar{h}]_i$ will always be bounded by one. In practice, loads 506 and 508 may be realized by active devices, but for simplicity they are represented as resistive loads in FIG. 5.

The voltage developed at nodes 510 and 512 are, respectively, $Z_L\gamma[\bar{h}]_i I_-$ and $Z_L\gamma[\bar{h}]_i I_+$, where $Z_L$ is the impedance of loads 506 and 508. The difference in voltages developed at nodes 512 and 510 is given by $\alpha Z_L\gamma[\bar{h}]_i(V_+-V_-)$. The difference in voltages developed at node 512 and 512 is seen to be proportional to the desired multiplication $[\bar{h}]_i(V_+-V_-)$ where the proportionality is the dimensionless scalar $\alpha Z_L\gamma$. This dimensionless scalar is not of theoretical concern because it is taken into account by the scale factor K when performing the filter weight update.

Figure 6:
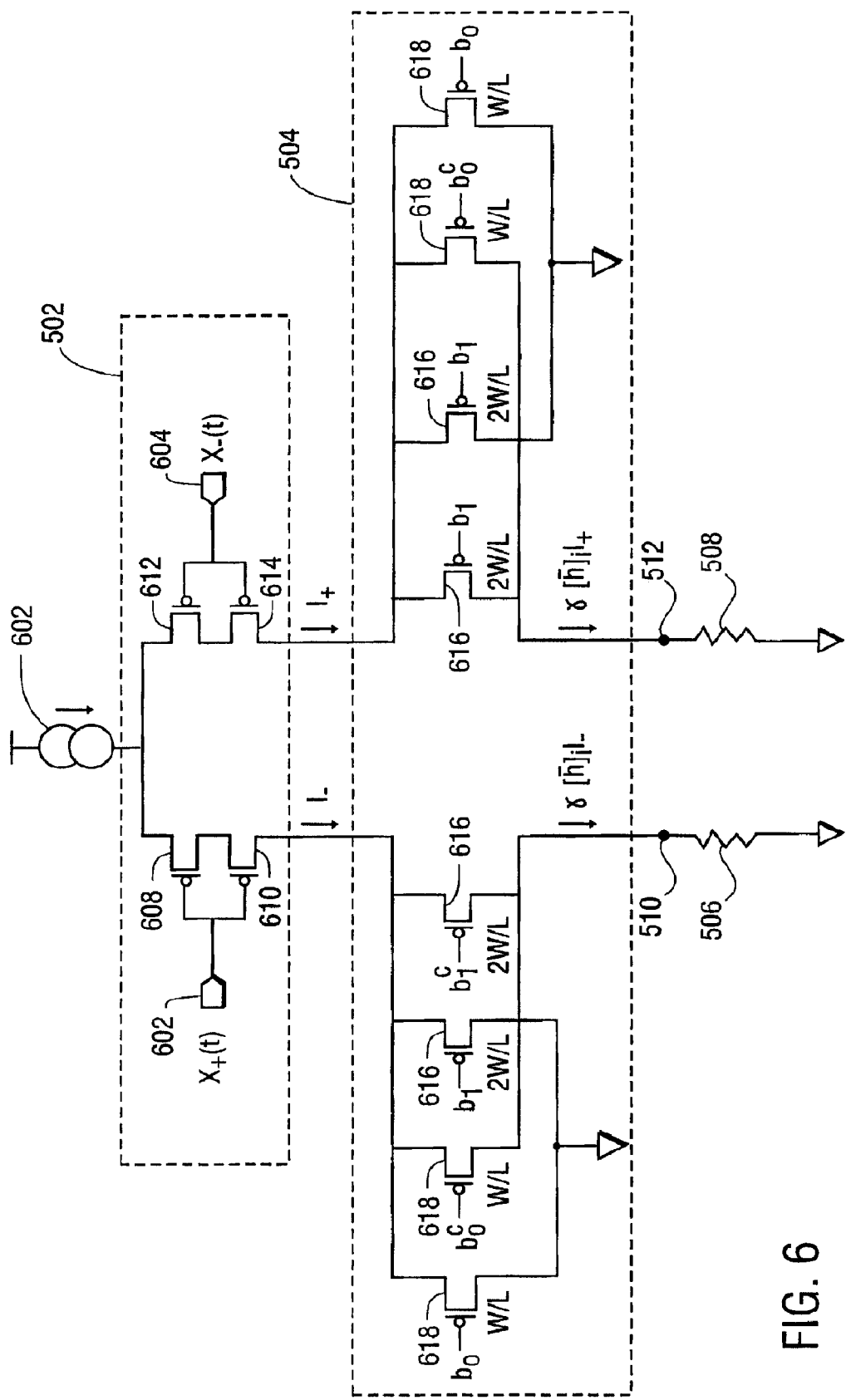
FIG. 6 is a more detailed illustration of the circuit of FIG. 5 for the special case of 2-bit multiplier weights.

An example of voltage-to-current converter 502 and current steering DAC 504 at the circuit level is shown in FIG. 6. For simplicity, only a 2-bit current steering DAC is shown, so that the filter weights are assumed to be represented by two-bit words each. It should be straightforward how any number of bits may be implemented. In FIG. 6, $b_1$ and $b_0$ are voltages representing binary variables, where a HIGH voltage represents the value 1 and a LOW voltage represents the value 0. Incurring the typical, but slight abuse of notation, we let $b_1$ and $b_0$ also represent binary variables, where $b_1^c$ and $b_0^c$ are, respectively, the logical complements of $b_1$ and $b_0$. It will be clear from context whether these variables represent voltages or binary values, and we may refer to these variables as either bits or signals (voltages). To implement multiplication by $[\bar{h}]_i$, the variables $b_1$ and $b_1$ are, respectively, the most significant bit and the least significant bit in the binary expression for $[\bar{h}]_i$. Without loss of generality, we may take the filter weights to be integers because $\gamma[\bar{h}]_i$ will always be bounded by one. With this convention, $[\bar{h}]_i=2b_1+b_0$.

Referring now to voltage-to-current converter 502 in FIG. 6, the differential voltage $\{x_+(t), x_-(t)\}$ is applied to input ports 602 and 604. Current source 602 provides bias current to a differential pair comprising pMOSFETs 608, 610, 612, and 614. The gates of pMOSFETs 608 and 610 are connected to input port 602, and the gates of pMOSFETs 612 and 614 are connected to input port 604. The combination of pMOSFET 608 to pMOSFET 610 looks like a classical cascode pair, save for the fact that the gate of pMOSFET 608 is not at a fixed voltage. A similar statement applies to the combination of pMOSFET 612 and pMOSFET 614. Accordingly, the voltage-to-current converter of FIG. 6 may be termed an active cascode voltage-to-current converter.

The betas of pMOSFET 608 and 610 may be chosen such that the active cascode configuration of pMOSFETs 608 and 610 forces pMOSFET 608 to operate in the triode region when pMOSFET 610 is in its active region. A similar statement applies to the combination of pMOSFETs 612 and 614. This may be observed as follows. Let $V_{S2}$ denote the source voltage of pMOSFET 610 and $V_{S1}$ denote the source voltage of pMOSFET 608. With pMOSFET 610 in its active region, $V_{S2}>V_g+|V_T|$, where $V_g$ is the gate voltage and $V_T$ is the threshold voltage. (For simplicity, we take the threshold voltage to be the same for pMOSFET 608 and 610.) Simple manipulation of the previous inequality yields $V_{GT}>V_{SD}$, where $V_{GT}$ is defined as $V_{S1}-V_g-|V_T|$ and $V_{SD}$ is the source-drain voltage $V_{S1}-V_{S2}$, which indicates that pMOSFET 608 operates in its triode region.

With pMOSFETs 608 and 612 operating in the triode region, they act approximately as resistors to degenerate pMOSFETs 610 and 614, respectively. Degeneration provides a relationship between the voltage difference $x_+(t)-x_-(t)$ and the current difference $I_+-I_-$ that is linear over a wider range than if degeneration was not present. ($I_+$ is the drain-source current for pMOSFETs 608 and 610, and $I_-$ is the drain-source current of pMOSFETs 612 and 614, respectively.) This is seen by considering a simple low frequency small-signal T-model for the active cascode voltage-to-current converter of FIG. 6, where it is easily shown that the input-output relationship of the voltage-to-current converter 502 is given by $I_+-I_-=g_e[x_+(t)-x_-(t)]$, where the effective transconductance $g_e$ is given by $g_e=1/(r_s+r_L)$, where $r_s=1/g_m$, the reciprocal of the small-signal transconductance $g_m$ for pMOSFETs 610 and 614, and $r_L$ is the triode region drain-source resistance for pMOSFETs 608 and 612. (For simplicity, we assume that the differential pair is matched.) If pMOSFETs 608 and 612 were not present, then the simple T-model provides $I_+-I_-=g_m[x_+(t)-x_-(t)]$. Clearly, $g_e<g_m$, so that degeneration lowers the effective transconductance. However, $r_s$ is a function of the input voltage, and it is seen that because $g_e=1/(r_x+r_L)$, there is less variation in $g_e$ with input voltage than for $g_m$.

To simplify the discussion of how multiplication is performed, we may without loss of generality normalize the filter weights to integers. This is so because $\gamma[\bar{h}]_i$ will always be bounded by one. That is, $\gamma$ absorbs any normalization constant. With this convention, $[\bar{h}]_i=2b_1+b_0$. Referring now to current steering DAC 504 in FIG. 6, varying amounts of current are shunted to ground, depending upon the signals $b_1$ and $b_0$. In the particular embodiment shown in FIG. 6, pMOSFETs 616 have a channel width-to-length ratio twice that of pMOSFETs 618. When $b_1$ and $b_0$ are both a binary 0 (LOW voltage), current from voltage-to-current 502 is shunted to ground by current steering DAC 504 so that the multiplier is zero. When $b_0$ is 1 and $b_1$ is 0, currents into nodes 510 and 512 receive ⅓ of the currents from voltage-to-current converter 502 so that the multiplier is ⅓. When $b_0$ is 0 and $b_1$ is 1, ⅔ of the currents from voltage-to-current converter 502 is passed through to loads 506 and 508 so that the multiplier is ⅔. When both $b_1$ and $b_0$ are 1, all of the currents from voltage-to-current converter 502 are passed through to loads 506 and 508 so that the multiplier is 1. From this discussion considering all the possible values for $b_1$ and $b_0$, it is seen that current steering DAC 504 multiplies the currents from voltage-to-current converter 502 by $\gamma[\bar{h}]_i$.

The multiplier circuit structure represented by current source 602, voltage-to-current converter 502, and current steering DAC 504 is repeated for each tap weight in FIR 402 of FIG. 4 with the appropriate input voltages. That is, each multiplier has its own current source, voltage-to-current converter, and current steering DAC, where for each $i=0, 1, \ldots, n-1$, the bit representation for $[\bar{h}]_i$ is provided to the current steering DAC of the $i^{th}$ multiplier circuit and the differential voltage $\{x_+(t-i), x_-(t-i)\}$ is provided to the voltage-to-current converter of the $i^{th}$ multiplier circuit. Extension of the multiplier circuit in FIG. 6 to arbitrary bit representations of the weights should be straightforward. This same circuit multiplier structure may also be used to perform the multiplication indicated by multiplier 408 in FIG. 4, where now the bit representation for the scale factor K is provided to the current steering DAC of multiplier 408 and the differential voltage $\{d_+(t), d_-(t)\}$ is provided to the voltage-to-current converter of multiplier 408.

The addition operation indicated by summer 410 is implemented by connecting the output ports of each current steering DAC for FIR 402 and multiplier 408 to loads 506 and 508. Which particular loads these output ports are connected to determine the sign of the multiplier. For example, without loss of generality, we may take a positive multiplicative weight to be implemented by connecting the output port in the $I_+$ current path to load 508 and the output port in the $I_-$ current path to load 506. Then, to implement multiplication by a negative weight, the output port in the $I_+$ current path is connected to load 506 and the output port in the $I_-$ current path to load 508.

Figure 7:
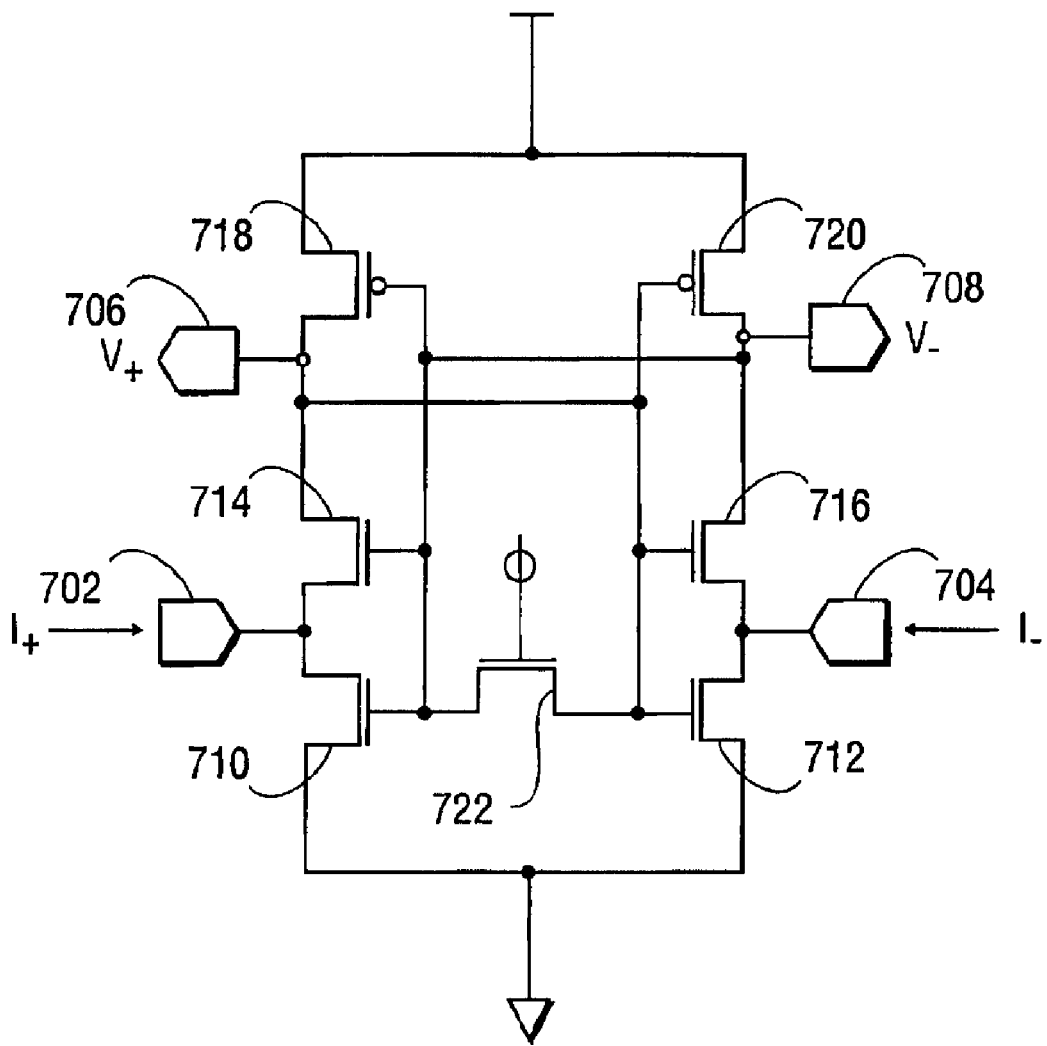
FIG. 7 is a circuit for a differential latch that may be used in the circuit of FIG. 4.

The combination of loads 506 and 508 (FIGS. 5 and 6) and comparator 412 (FIG. 4) may be realized by the circuit of FIG. 7, which may be referred to as an active cascode differential latch. In FIG. 7, nMOSFETs 714 and 716 play the role of active cascode transistors, although they are not cascode transistors in the classical sense because their gate voltages are not biased to a constant voltage. Input port 702 is connected to node 512 and input port 704 is connected to node 510. A clock signal in FIG. 7 is denoted by $\phi$. When clock signal $\phi$ is HIGH, pre-charge transistor 722 provides a low impedance path between the gates of transistors 710 and 712, pre-charging the differential latch so that the output voltages at output ports 706 and 708 are forced to be substantially equal to one another. When clock signal $\phi$ is LOW, pre-charge transistor 722 switches OFF to put the differential latch in an evaluation mode, where a differential voltage at output ports 706 and 708 develops in response to the currents (or voltages) at input ports 702 and 704.

If more current is sourced to input port 702 than is sourced to input port 704, then the output voltage at output port 706 increases, and the output voltage at output port 708 decreases. Cross coupled pMOSFETs 718 and 720 are connected as a latch, so that the differential voltages developed at output ports 706 and 708 are amplified to a complementary logic levels. The resulting complementary voltages may both be used in subsequent digital processing, or only one of the complementary voltages may be used. For example, dual rail logic may be employed in some or all of the subsequent digital processing.

An argument similar to that which was made with respect to the voltage-to-current converter in FIG. 6 shows that device sizes may be easily chosen such that nMOSFETs 710 and 712 operate in their triode regions and nMOSFETs 714 and 716 operate in their active regions. With nMOSFETs 710 and 712 operating in their triode regions, the differential latch of FIG. 7 has a relatively low input impedance, and furthermore, these nMOSFETs require a relatively small amount of headroom voltage. This may be important as supply voltages are scaled lower and lower, because voltage headroom for analog circuit blocks may be a critical issue. A small headroom voltage requirement also improves the input common-mode voltage range of the stages previous to the differential latch, i.e., the voltage-to-current converters and current steering DACs.

As discussed earlier, the scale factor K takes into account various scaling factors due to the communication channel and circuit implementation. The scale factor K affects the available noise margin, so it is important to set its value appropriately. The optimal value for K depends on the communication channel characteristics, which usually are not known a priori. A relatively simple method for calibrating K making use of a received training sequence is shown in the flow diagram of FIG. 8.

In block 802, K is initialized to zero. In block 804, the filter is updated over a training sequence. During this update, a count is made of the number of overflows in the components of the filter vector. In block 806, the overflow count is compared to a threshold $\lambda$. If the overflow count is greater than $\lambda$, control is brought to block 808, in which case the current value for K is decremented by $\Delta$ and the calibration ends. If the overflow count is less than $\lambda$, control is brought to block 810 where K is incremented by $\Delta$, and control is brought to block 804 to begin another update sequence for the filter weights with the new value for K. Block 806 may be modified to shift control to block 808 if the overflow count is greater than or equal to the threshold $\lambda$.

The overflow count threshold $\lambda$ and scale factor calibration increment $\Delta$ are chosen before calibration is performed. These scalars may be determined offline via simulations with expected communication channels. In some embodiments, the overflow count threshold may be set to a value less than 1% of the length of the training sequence. The calibration increment trades off coarseness with the number of times block 804 is performed. In practice, calibration of the scale factor need not be performed very often, and may in some instances be performed only once for a communication channel.

Figure 8:
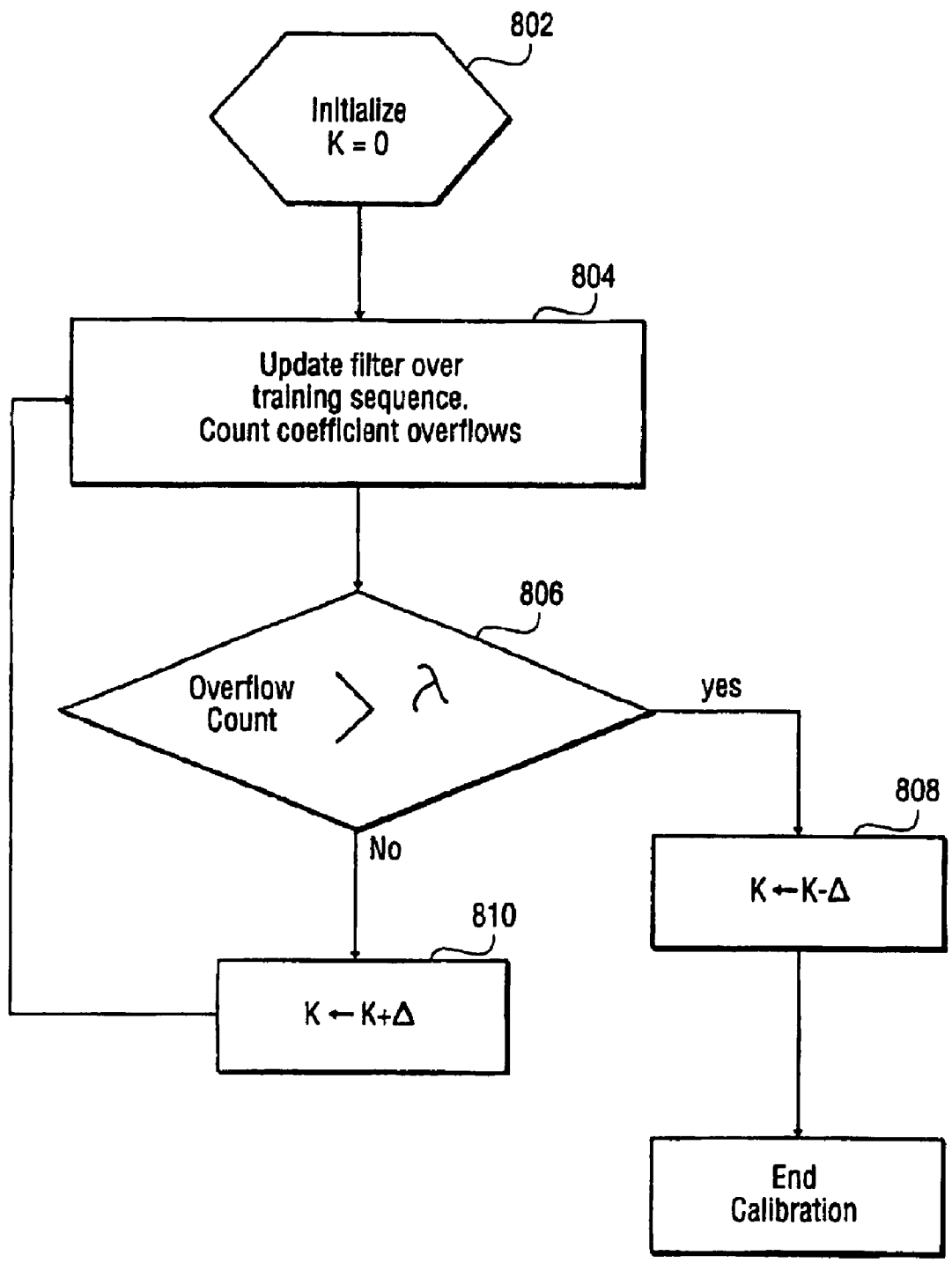
FIG. 8 is a flow diagram illustrating a method for calibrating the scale factor used in the circuit of FIG. 4.
Figure 9:
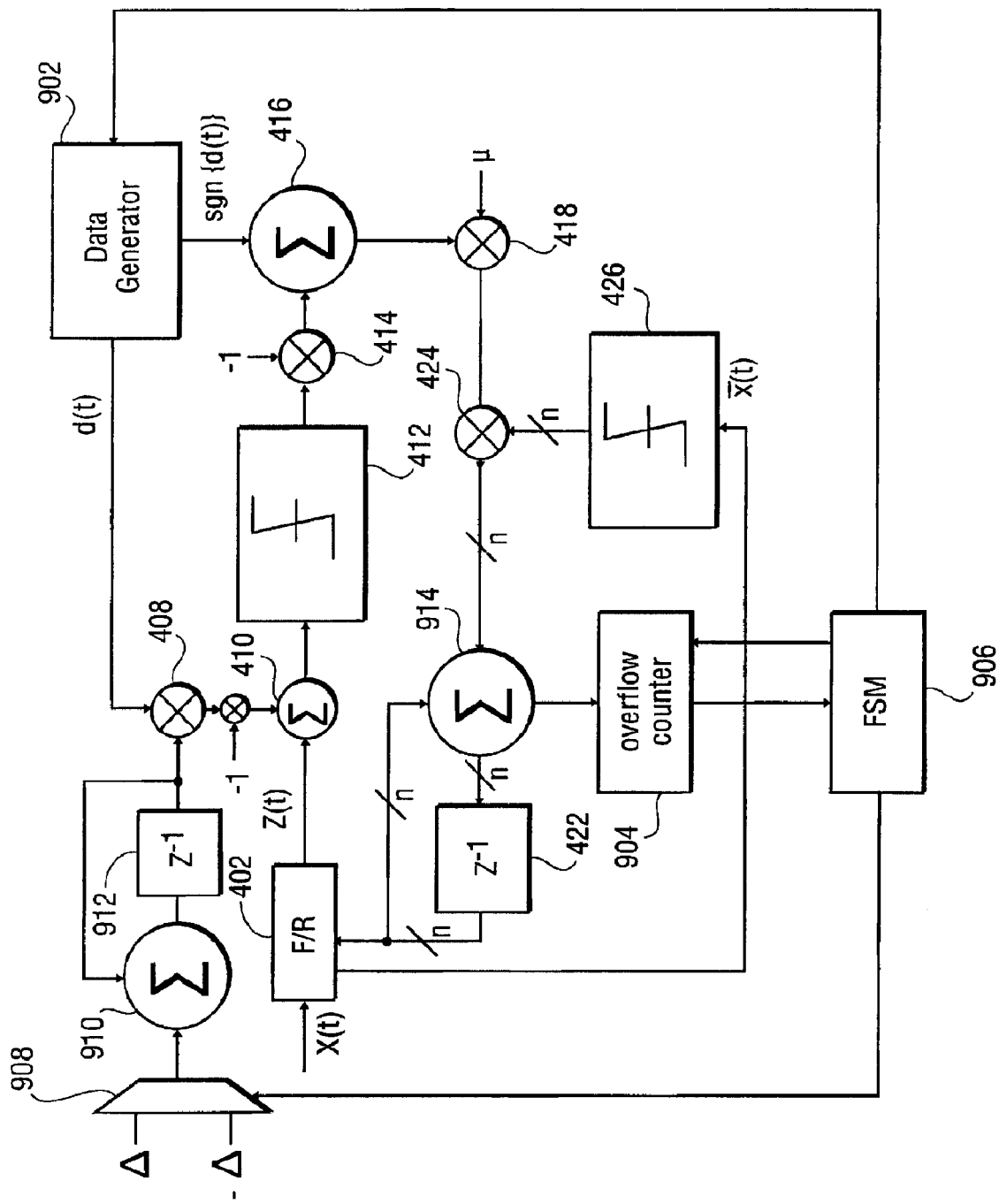
FIG. 9 illustrates a circuit at a high-level functional level for implementing the calibration method of FIG. 8 for the adaptive equalizer of FIG. 4.

A hardware implementation for the calibration method of FIG. 8 is shown at a high-level in FIG. 9. Many of the functional units shown in FIG. 9 have equivalents in FIG. 4 and are labeled accordingly with the same numerals. These functional units need not be described again. For simplicity, functional units 404 and 406 in FIG. 4 have been combined into functional unit 902. In addition to the functional units shown in FIG. 4, FIG. 5 also includes overflow counter 904, finite state machine (FSM) 906, multiplexer 908, summer 910, delay element 912, and summer 914. As seen in FIG. 9, calibration of K adds only a modest amount of hardware to implementing the filter update.

Summer 914 is similar to summer 420 in FIG. 4, but a different numerical label is used to emphasize that summer 914 provides an overflow signal to overflow counter 904 to indicate when a numerical overflow occurs during summation. Overflow counter 904 keeps track of the number of numerical overflows during a training sequence period (block 804). FSM 906 initializes overflow counter 904 before the beginning of a training sequence, and controls data generator 902 to begin generating a sequence of data symbols when a new iteration on a training sequence begins.

Functional units 908, 910, and 912 perform either block 808 or block 810. Delay element 912 indicates a delay of L, which denotes the length of a training sequence. If at the end of a training sequence the overflow counter indicates that the overflow count is greater than the threshold $\lambda$, FSM 906 sends a control signal to multiplexer 908 so that $-\Delta$ is added to the current value of K for use in the next training sequence. Otherwise, $\Delta$ is added to the current value of K. As discussed with respect to block 806, this procedure may be modified so that $-\Delta$ is added when the overflow count is greater than or equal to the threshold $\lambda$.

Figure 10:
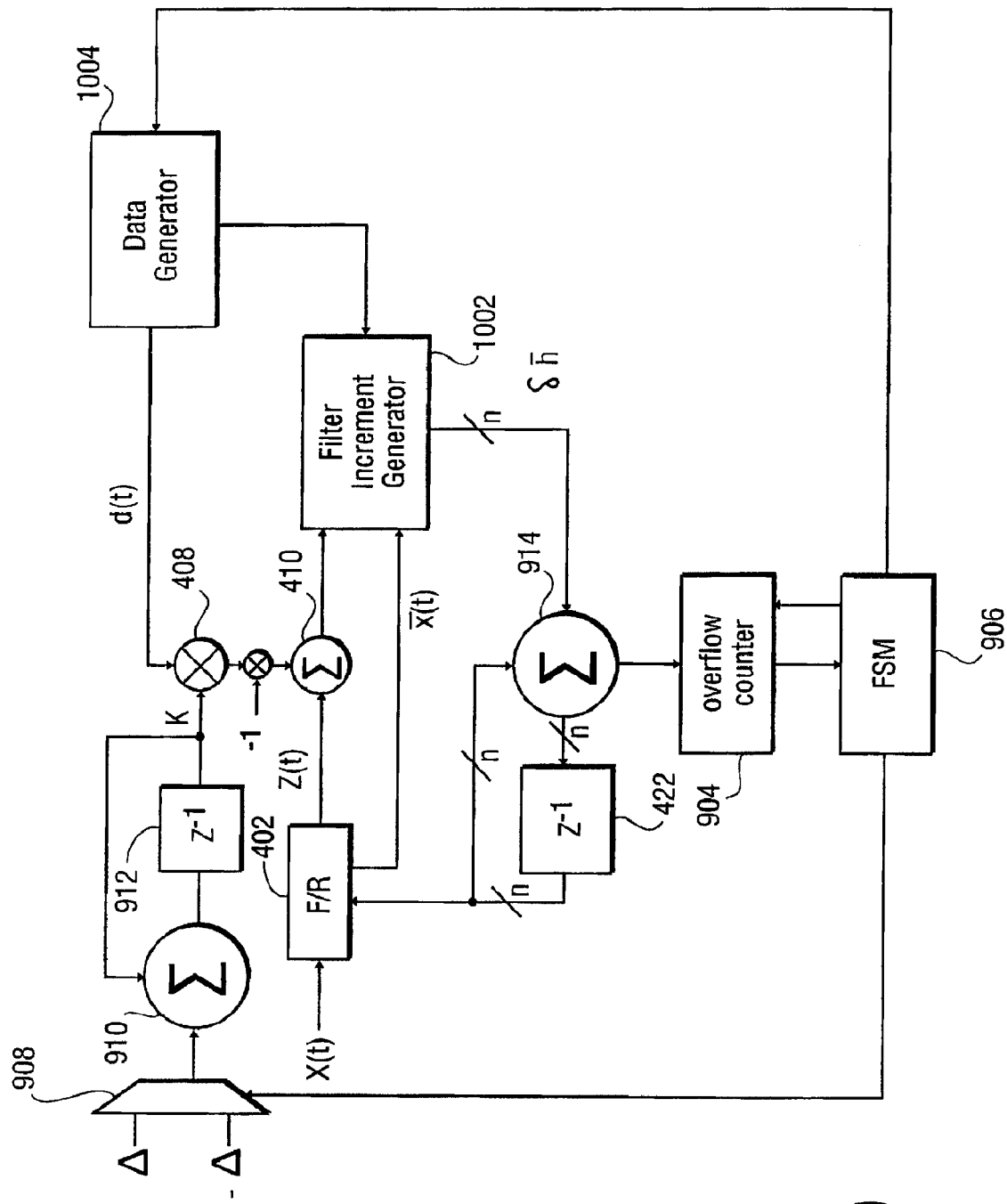
FIG. 10 illustrates a circuit at a high-level functional level for implementing the calibration method of FIG. 8 for a wide class of adaptive equalizers.

The method outlined in FIG. 8 need not be limited to the filter update indicated by equation (1), but may also be used for other filter update algorithms involving a scale factor, such as, for example, the LMS and sign-sign LMS algorithms discussed in the Background section. With this in mind, the hardware diagram of FIG. 9 may be generalized to that of FIG. 10. Referring to FIG. 10, filter increment generator 1002 receives as input the difference $z(t)-Kd(t)$ from summer 410 and the received data vector $\bar{x}(t)$ from FIR 402, and outputs to summer 914 the increment vector $\delta\bar{h}(t)$ that is to be summed with the current filter vector $\bar{h}(t)$ to arrive at the updated filter vector $\bar{h}(t+1)$. That is, $\bar{h}(t+1)=\bar{h}(t)+\delta\bar{h}(t)$. Data generator 1002 is labeled with a different numeral to indicate that it may or may not provide data information, such as $\text{sgn}\{d(t)\}$, to filter increment generator 1002.

Many modifications may be made to the disclosed embodiments without departing from the scope of the invention as claimed below. For example, in the case of single-ended signaling, one of the input voltages to the various voltage-to-current converters is held constant instead of being part of a differential signal. Furthermore, the circuit structure disclosed here to implement weight multiplication in the analog domain merely serves as an example, and is not meant to limit the scope of the invention in any way. For example, it is to be noted that the channel width-to-length ratios for the pMOSFETs used in the current multiplier need not be powers of two. That is, it is not necessary that multiplication be performed in binary arithmetic. Also, the duals to the disclosed circuits may be implemented, where nMOSFETs replace pMOSFETs, and pMOSFETs replace nMOSFETs. Other circuit structures for performing multiplication and summation in the analog domain may be employed. Indeed, the multiplication and summation may also be performed entirely in the digital domain, although such circuit implementations, which would require analog-to-digital converters, may at this time not be practical for high-speed communication channels.

The partitioning of a circuit into simpler, functional units is somewhat arbitrary, and the particular functional units disclosed here are not meant to limit the scope of the invention. Various functional units may be combined into more complicated functional units, and functional units may be partitioned into simpler functional units. An example is the combining of functional units 404 and 406 of FIG. 4 into data generator functional unit 902 of FIG. 9. Furthermore, the various summers and multipliers disclosed here may be re-arranged as implied by arithmetic commutative and associative laws. In particular, it is to be understood in the claims below that the term "summer" also may mean a functional unit for performing a differencing operation. Furthermore, "a digital summer" may comprise more than one summer to operate on more than one pair of operands in parallel. Similarly, "a delay element" may comprise more than one delay elements to delay more than one value in parallel. Similar remarks apply to multipliers and latches.

It is also to be understood in the claims below that the various summers and multipliers, whether realized in the digital domain or analog domain, may perform their indicated operations only approximately. For example, in the analog domain, it is not possible to match transistors exactly, so that a multiplication is not exact. Or, for example, in the digital domain there may be a numerical overflow.

Regarding calibration of the scale factor K, training sequences for the calibration may be a repetition of a training sequence, or segments of one long training sequence. Furthermore, the increment used in block 808 of FIG. 8 need not be the same increment as that used in block 810, an the increment may be made to vary each time control is brought to block 802.

What is claimed is:

1. A circuit to calibrate a scalar in an adaptive equalizer during a training sequence, the circuit comprising:
   a discrete-time FIR (Finite Impulse Response) filter comprising n multiplier units to implement a filter response $[\bar{h}(t)]_i$, $i=0,1,\ldots,n-1$, where t is a time index;
   a data generator to provide a discrete-time sequence of desired voltages $d(t)$, $t=1,2,\ldots,T$;
   a multiplier to provide a sequence of voltages $Kd(t)$, $t=1,2,\ldots,T$, where K is the scalar;
   a filter increment generator to provide, for $t=1,2,\ldots,T$, n voltages indicative of n filter increments $[\delta\bar{h}(t)]_i$, $i=0,1,\ldots,n-1$;
   at least one summer to perform the sum $[\bar{h}(t)]_i+[\delta\bar{h}(t)]_i$, $i=0,1,\ldots,n-1$, to update the filter response;
   an overflow counter to provide an overflow count indicative of the number of numerical overflows in the at least one summer during the time period $t=1,2,\ldots,T$;
   wherein the scalar K is increased by a first increment if after completion of the time period $t=1,2,\ldots,T$ the overflow count and a threshold satisfy a first relationship, and
   wherein the scalar K is used during the training sequence to update the adaptive equalizer.

2. The circuit as set forth in claim 1, wherein the scalar K is decreased by a second increment if after completion of the time period $t=1,2,\ldots,T$ the overflow count and the threshold satisfy a second relationship.

3. The circuit as set forth in claim 2, wherein the first increment is equal to the second increment.

4. The circuit as set forth in claim 3, wherein
   the overflow count and the threshold satisfy the first relationship if and only if the overflow count is greater than the threshold;
   the overflow count and the threshold satisfy the second relationship if and only if the overflow count is less than or equal to the threshold; and
   the first increment is positive.

5. The circuit as set forth in claim 1, wherein
   the overflow count and the threshold satisfy the first relationship if and only if the overflow count is greater than the threshold; and
   the first increment is positive.

6. The circuit as set forth in claim 5, the multiplier comprising:
   a voltage-to-current converter to provide as output a current $I_{vC}$, indicative of the voltage $d(t)$; and
   a current steering digital-to-analog converter to shunt a portion of $I_{vC}$, to provide as output at time t a current indicative of $Kd(t)$.

7. The circuit as set forth in claim 2, wherein
the overflow count and the threshold satisfy the first relationship if and only if the overflow count is greater than the threshold;
the overflow count and the threshold satisfy the second relationship if and only if the overflow count is less than or equal to the threshold; and
the first increment and the second increment are positive.

8. The circuit as set forth in claim 1, wherein the voltage d(t) is a differential voltage.

9. A computer system for use in calibrating a scalar in an adaptive equalizer during a training sequence comprising:
a board comprising a first transmission line and a second transmission line; and
a receiver coupled to the first and second transmission lines, the receiver comprising:
a discrete-time FIR (Finite Impulse Response) filter comprising n multiplier units to implement a filter response $[\bar{h}(t)]_i$, i=0,1, ..., n−1, where t is a time index;
a data generator to provide a discrete-time sequence of desired voltages d(t), t=1,2, ..., T;
a multiplier to provide a sequence of voltages Kd(t), t=1,2, ..., T, where K is the scalar;
a filter increment generator to provide, for t=1,2, ..., T, n voltages indicative of n filter increments $[\delta\bar{h}(t)]_i$, i=0,1, ..., n−1;
at least one summer to perform the sum $[\bar{h}(t)]_i + [\delta\bar{h}(t)]_i$, i=0,1, ..., n−1 to update the filter response;
an overflow counter to provide an overflow count indicative of the number of numerical overflows in the at least one summer during the time period t=1,2, ..., T;
wherein the scalar K is increased by a first increment if after completion of the time period t=1,2, ..., T the overflow count and a threshold satisfy a first relationship, and
wherein the scalar K is used during the training sequence to update the adaptive equalizer.

10. The computer system as set forth in claim 9, wherein the scalar K is decreased by a second increment if after completion of the time period t=1,2, ..., T the overflow count and the threshold satisfy a second relationship.

11. The computer system as set forth in claim 9, wherein the voltage d(t) is a differential voltage.

12. A method to calibrate a scale factor in an adaptive equalizer, the scale factor being used to multiply a sequence of desired voltages used in updating the equalizer during a training sequence, the method comprising:
updating the adaptive equalizer over the training sequence;
counting the number of numerical overflows occurring while updating the adaptive equalizer over the training sequence; and
increasing the scale factor by a first increment if the number of numerical overflows and a threshold satisfy a first relationship,
wherein the scale factor is calibrated once for a communication channel.

13. A method to calibrate a scale factor in an adaptive equalizer, the scale factor being used to multiply a sequence of desired voltages used in updating the equalizer during a training sequence, the method comprising:
updating the adaptive equalizer over the training sequence;
counting the number of numerical overflows occurring while updating the adaptive equalizer over the training sequence; and
increasing the scale factor by a first increment if the number of numerical overflows and a threshold satisfy a first relationship,
wherein the scale factor is decreased by a second increment if the number of numerical overflows and the threshold satisfy a second relationship.

14. The method as set forth in claim 13, wherein the first increment is equal to the second increment.

15. The method as set forth in claim 14, wherein
the overflow count and the threshold satisfy the first relationship if and only if the overflow count is greater than the threshold;
the overflow count and the threshold satisfy the second relationship if and only if the overflow count is less than or equal to the threshold; and
the first increment is positive.

16. A method to calibrate a scale factor in an adaptive equalizer, the scale factor being used to multiply a sequence of desired voltages used in updating the equalizer during a training sequence, the method comprising:
updating the adaptive equalizer over the training sequence;
counting the number of numerical overflows occurring while updating the adaptive equalizer over the training sequence; and
increasing the scale factor by a first increment if the number of numerical overflows and a threshold satisfy a first relationship,
wherein
the overflow count and the threshold satisfy the first relationship if and only if the overflow count is greater than the threshold; and
the first increment is positive.

17. The method as set forth in claim 13, wherein the overflow count and the threshold satisfy the first relationship if and only if the overflow count is greater than the threshold;
the overflow count and the threshold satisfy the second relationship if and only if the overflow count is less than or equal to the threshold; and
the first increment and the second increment are positive.

18. The method as set forth in claim 12, wherein the sequence of desired voltages are differential voltages.

* * * * *

UNITED STATES PATENT AND TRADEMARK OFFICE
CERTIFICATE OF CORRECTION

PATENT NO.         : 7,313,181 B2                                                Page 1 of 1
APPLICATION NO. : 10/660415
DATED                : December 25, 2007
INVENTOR(S)       : Balamurugan et al.

It is certified that error appears in the above-identified patent and that said Letters Patent is hereby corrected as shown below:

In column 10, line 31, in Claim 1, delete " $[\bar{h}(t)]_{i,} + [\delta\bar{h}(t)]_{i,}$ " and insert -- $[\bar{h}(t)]_i + \delta\bar{h}(t)]_i,$ --, therefor.

In column 10, line 64, in Claim 6, delete "$I_{vC,}$" and insert -- $I_{VC,}$ --, therefor.

In column 10, line 66, in Claim 6, delete "$I_{vC,}$" and insert -- $I_{VC,}$ --, therefor.

In column 11, line 27, in Claim 9, delete " $[\bar{h}(t)]_{i,} + [\delta\bar{h}(t)]_{i,}$ " and insert -- $[\bar{h}(t)]_i + \delta\bar{h}(t)]_i,$ --, therefor.

In column 12, line 28, in Claim 16, delete "egualiser," and insert -- equalizer, --, therefor.

Signed and Sealed this

Twentieth Day of May, 2008

JON W. DUDAS
*Director of the United States Patent and Trademark Office*